United States Patent
Dexter et al.

(10) Patent No.: US 11,535,457 B2
(45) Date of Patent: Dec. 27, 2022

(54) ATTACHMENT ASSEMBLY FOR A CONTROLLER HOUSING

(71) Applicant: Eaton Intelligent Power Limited, Dublin (IE)

(72) Inventors: Alex Dexter, Lake Stevens, WA (US); Shane Rowell, Arlington, WA (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/383,812

(22) Filed: Jul. 23, 2021

(65) Prior Publication Data

US 2022/0039270 A1    Feb. 3, 2022

Related U.S. Application Data

(60) Provisional application No. 63/059,799, filed on Jul. 31, 2020.

(51) Int. Cl.
| | |
|---|---|
| *B65G 43/00* | (2006.01) |
| *B65G 43/08* | (2006.01) |
| *B65G 41/00* | (2006.01) |
| *H05K 5/00* | (2006.01) |

(52) U.S. Cl.
CPC .......... *B65G 43/00* (2013.01); *B65G 41/008* (2013.01); *B65G 43/08* (2013.01); *H05K 5/0073* (2013.01)

(58) Field of Classification Search
CPC ...... H05K 5/0073; B65G 43/00; B65G 43/08; B65G 41/002; B65G 41/008; B65G 65/28; B65G 2203/0283; B65G 2203/0291; B65G 2203/042; B65G 2811/095
USPC .................................. 198/781.06, 783, 575
See application file for complete search history.

(56) References Cited

U.S. PATENT DOCUMENTS

| | | | | |
|---|---|---|---|---|
| 5,862,907 | A * | 1/1999 | Taylor | B65G 47/261 |
| | | | | 198/781.05 |
| 6,302,266 | B1 * | 10/2001 | DeFrancisco | B65G 47/263 |
| | | | | 198/781.06 |
| 7,226,310 | B1 | 6/2007 | Dickrell et al. | |
| 9,893,477 | B2 * | 2/2018 | Kuppel | H01R 9/2608 |
| 10,089,276 | B1 | 10/2018 | Rees | |
| 10,268,173 | B2 | 4/2019 | Rees | |
| 2006/0086593 | A1 * | 4/2006 | Brown | B65G 13/06 |
| | | | | 198/781.06 |
| 2006/0272929 | A1 * | 12/2006 | Taylor | B65G 47/261 |
| | | | | 198/781.06 |

(Continued)

*Primary Examiner* — James R Bidwell
(74) *Attorney, Agent, or Firm* — DiBerardino McGovern IP Group LLC

(57) ABSTRACT

An apparatus includes: a housing that encloses a controller configured to control a conveyor system; and an attachment assembly attached to a first side of the housing. The attachment assembly is configured to attach the housing to a side channel of the conveyor system, and the attachment assembly includes an attachment piece, the attachment piece including: a first latch member configured for connection to a first interface on the side channel of the conveyor system; and a second latch member configured for connection to a second interface on the side channel of the conveyor system. When one or more of the first latch member is connected to the first interface and the second latch member is connected to the second interface, the housing is attached to the side channel with a space between the side channel and the first side of the housing.

22 Claims, 9 Drawing Sheets

(56) References Cited

U.S. PATENT DOCUMENTS

2016/0083194 A1\* 3/2016 Specht .................. B65G 43/10
198/575
2020/0010281 A1\* 1/2020 Koike ................... B65G 21/00

\* cited by examiner

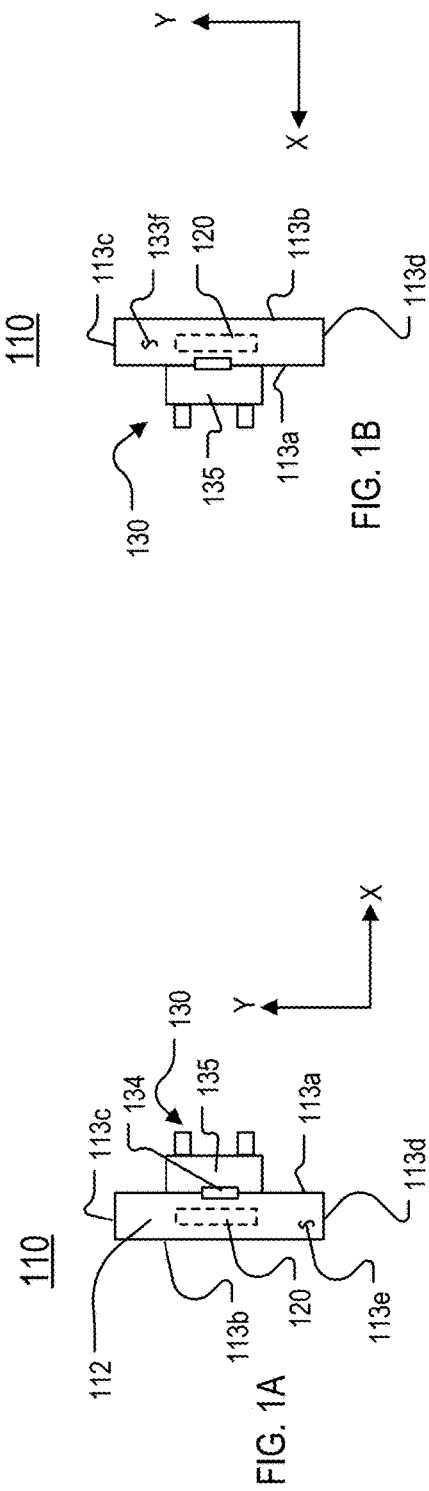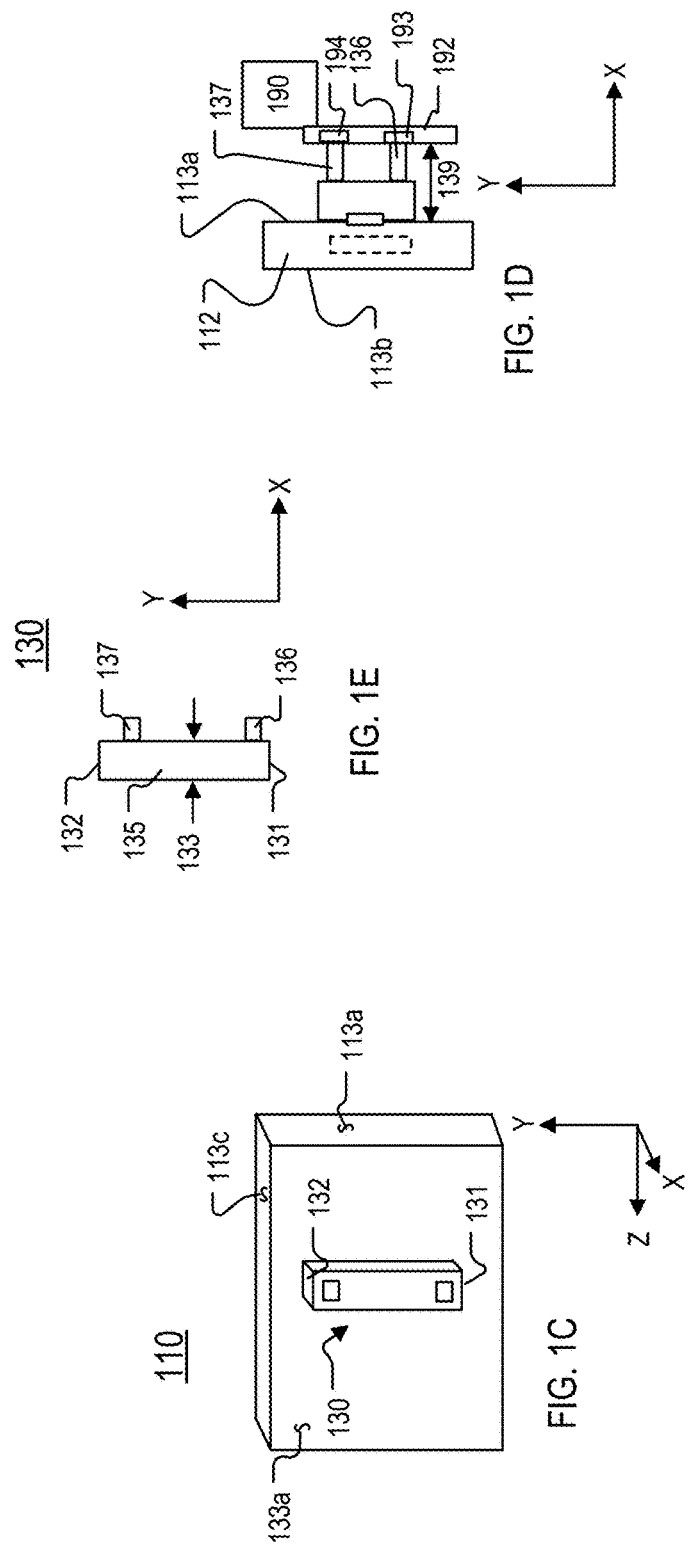

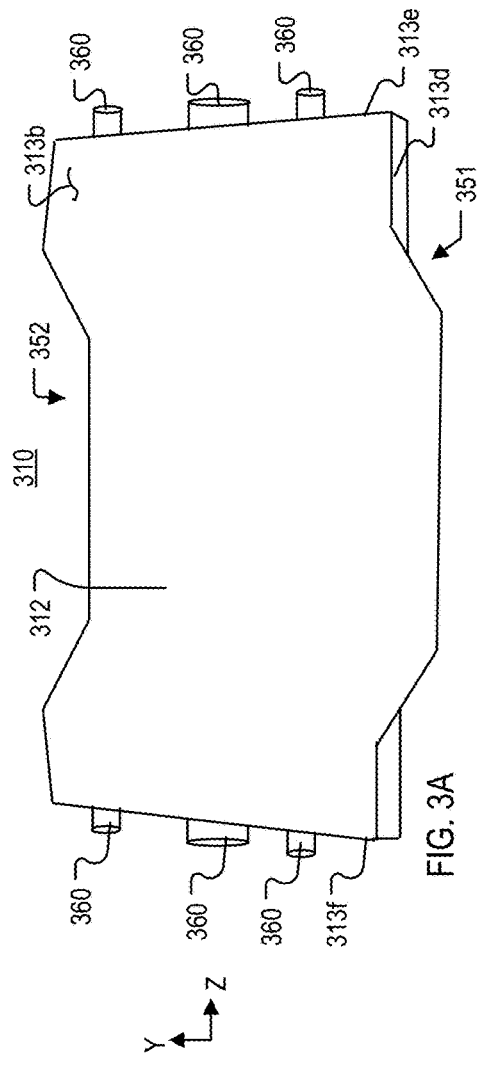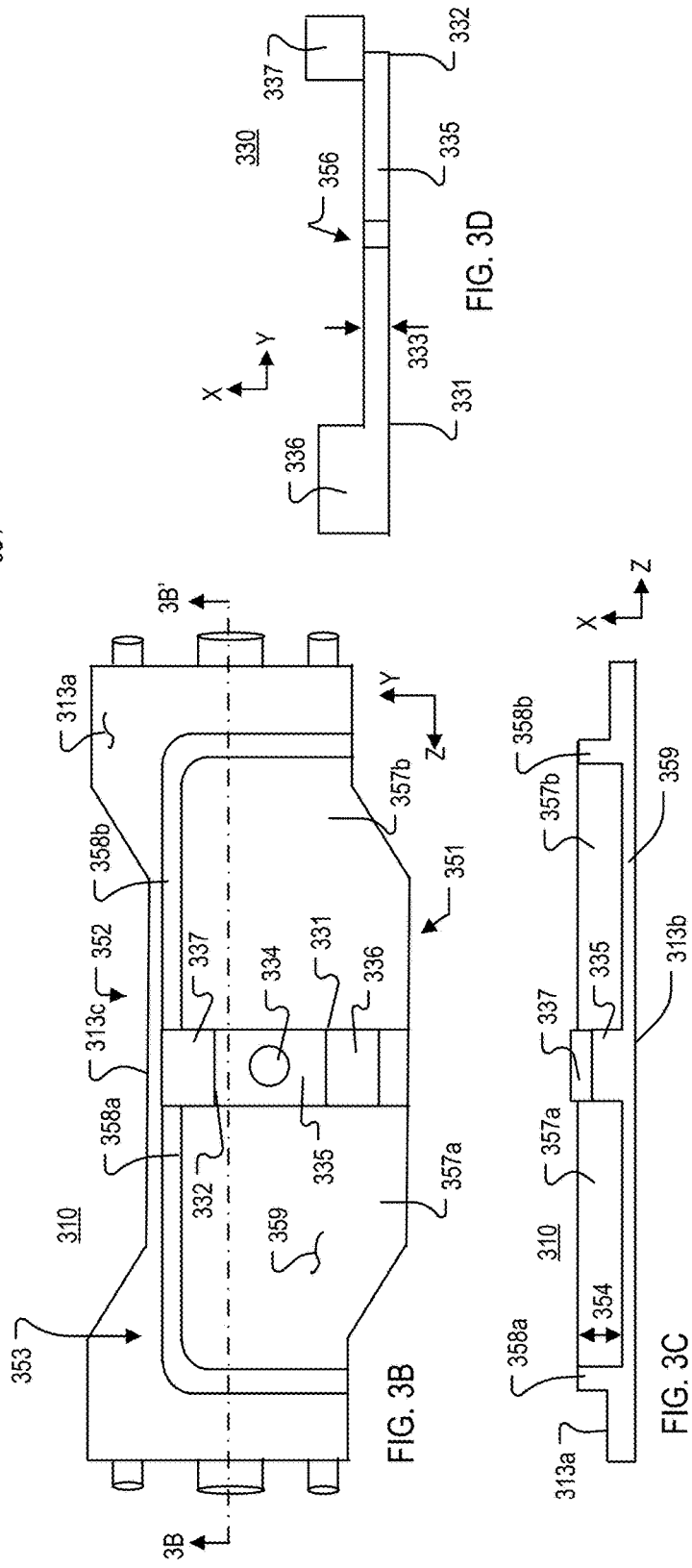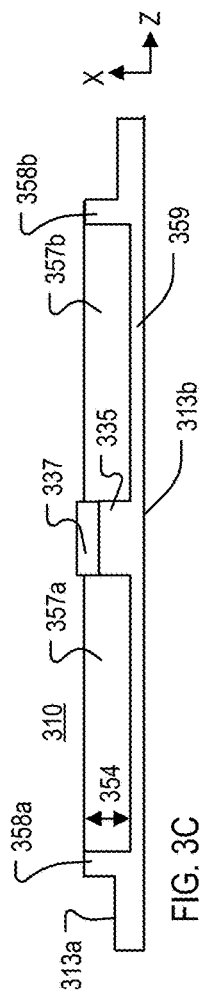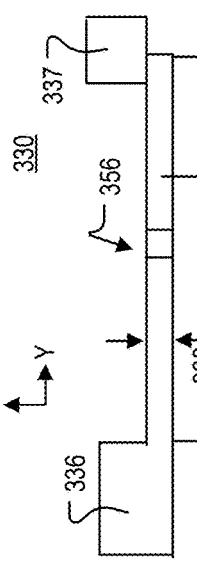

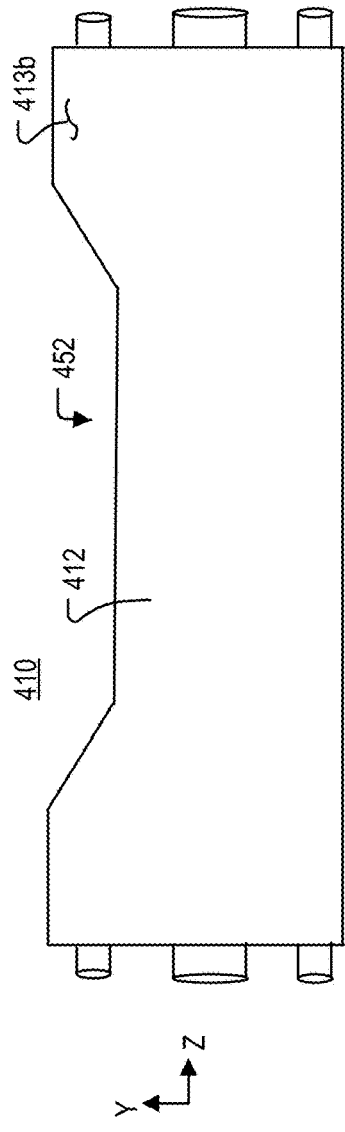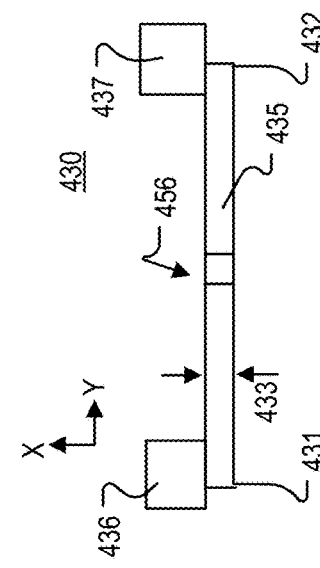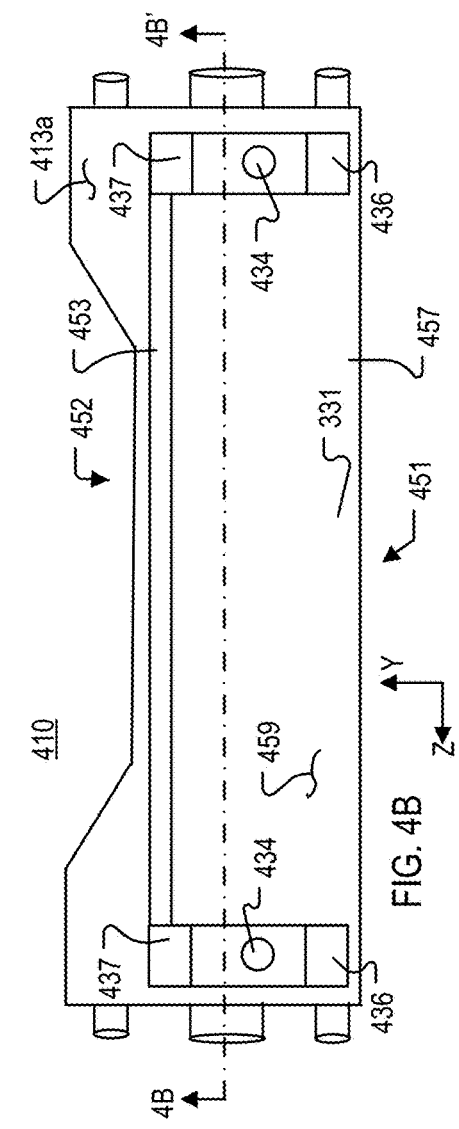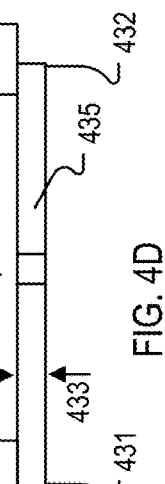

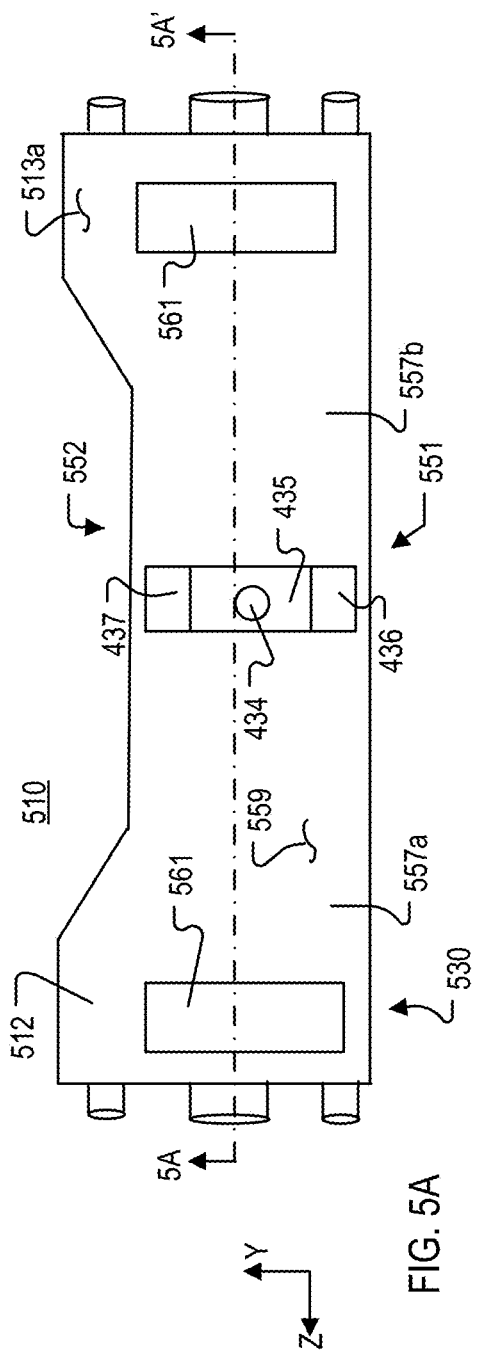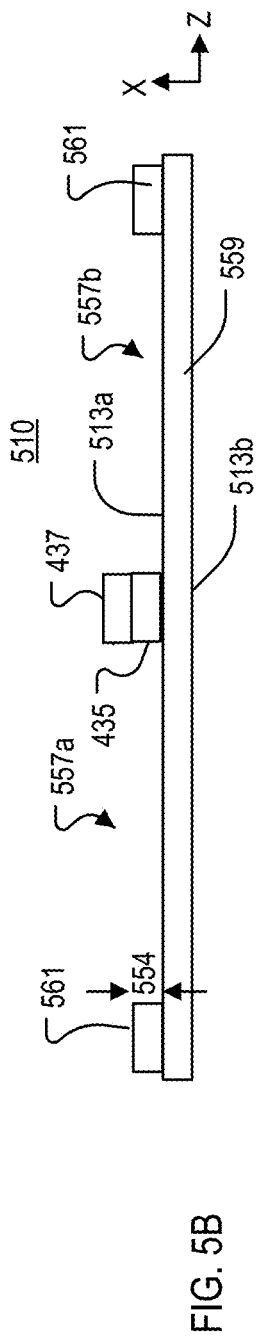
FIG. 5A
FIG. 5B

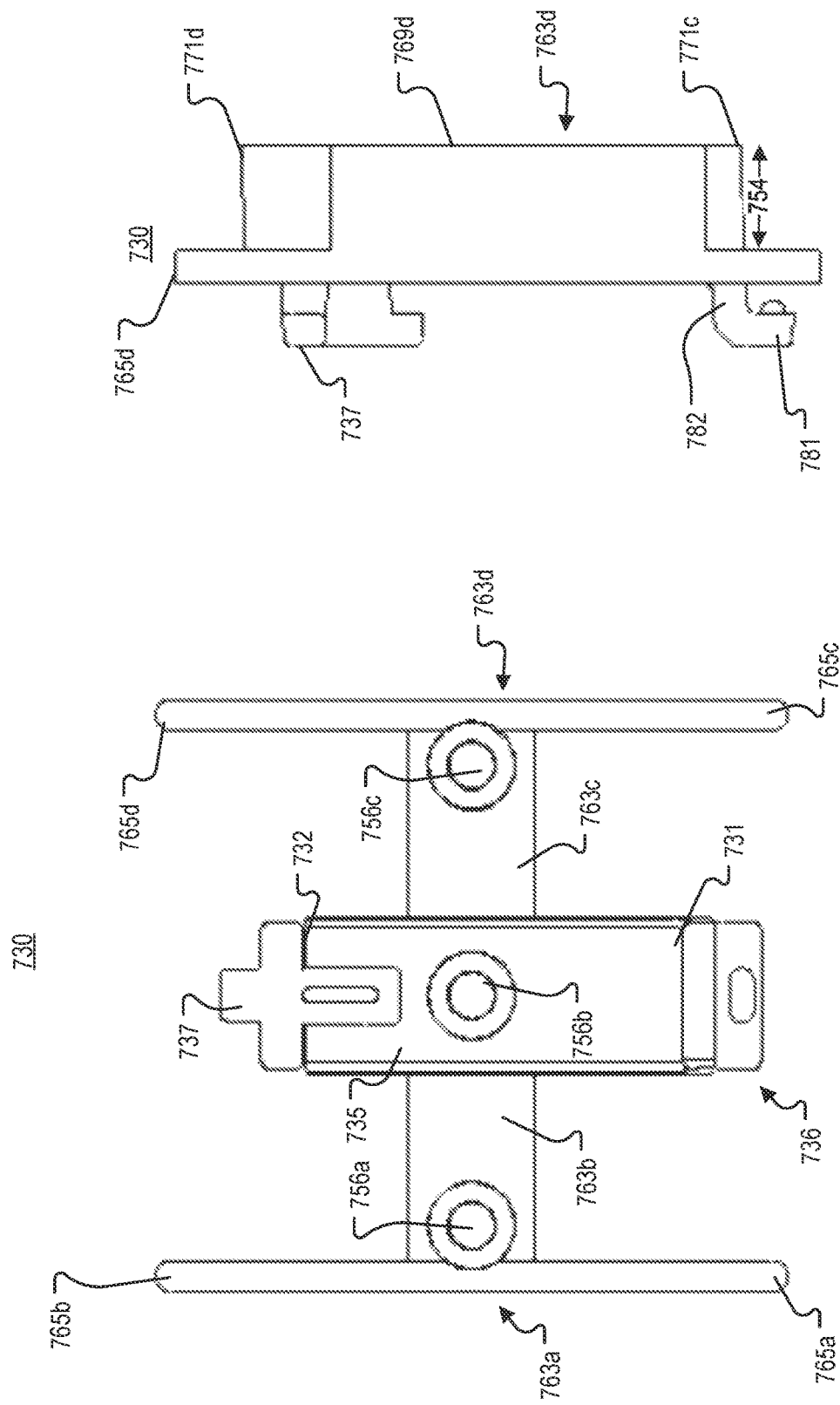

ATTACHMENT ASSEMBLY FOR A CONTROLLER HOUSING

CROSS-REFERENCE TO RELATED APPLICATION

This application claims the benefit of U.S. Provisional Application No. 63/059,799, filed on Jul. 31, 2020 and titled ATTACHMENT ASSEMBLY FOR A CONTROLLER HOUSING, which is incorporated herein by reference in its entirety.

TECHNICAL FIELD

This disclosure relates to an attachment assembly for a controller housing.

BACKGROUND

A controller for an industrial process (such as a conveyor system) is enclosed in a housing. The controller may be used to control an electric motor or other machines. More than one electric motor or machine may be controlled by the controller, for example, the controller may be a multi-zone controller.

SUMMARY

In one aspect, an apparatus includes: a housing that encloses a controller configured to control a conveyor system; and an attachment assembly attached to a first side of the housing. The attachment assembly is configured to attach the housing to a side channel of the conveyor system, and the attachment assembly includes an attachment piece, the attachment piece including: a first latch member configured for connection to a first interface on the side channel of the conveyor system; and a second latch member configured for connection to a second interface on the side channel of the conveyor system. When one or more of the first latch member is connected to the first interface and the second latch member is connected to the second interface, the housing is attached to the side channel with a space between the side channel and the first side of the housing.

Implementations may include one or more of the following features. The first latch member may be configured for insertion into a first opening on a side channel of the conveyor system; and the second latch member may be configured for insertion into a second opening on the side channel. The attachment piece may extend from a first end to a second end, the first latch member may be closer to the first end than the second end, and the second latch member may be closer to the second end than the first end. The attachment piece may include an attachment member that is in direct physical contact with the first side of the housing, a first flange that extends from the attachment member to the first end, and a second flange that extends from the attachment member to the second end; the first flange and the second flange are not in direct physical contact with the first side of the housing and are separated from the first side of the housing by a gap; and the gap is sufficient to accommodate at least one cable. The housing also may include a top portion, and, in these implementations, when the first latch is inserted in the first opening and the second latch is inserted in the second opening, a notched region of the top portion accommodates an item of the conveyor system that extends through the side channel. The housing also may include a bottom portion including a protrusion portion that fits into a notched region on a top portion of a separate apparatus.

The attachment piece may be removeably attached to the first side of the housing.

The attachment piece and the housing may be a single piece, and, in these implementations, the attachment piece is not removable from the first side of the housing.

The space between the side channel and the first side may have an extent, and the extent may be determined by a thickness of the attachment piece.

The first side of the housing may include a base surface and a wall that extends outward from the base surface to a height, the attachment piece may have a thickness that is the same as the height of the wall, and the space may have an extent that is the same as the thickness of the attachment piece and the height of the wall. The attachment piece may be a first attachment piece, and the attachment assembly also may include a second attachment piece; and the first attachment piece and the second attachment piece may be attached to opposite ends of the first side, and the wall may extend between the first attachment piece and the second attachment piece.

The attachment piece may be a first attachment piece, and the attachment assembly may include at least one other attachment piece. All of the attachment pieces may be removeably attached to the first side. In some implementations, only the first attachment piece includes the first latch member and the second latch member.

The housing also may include at least one data interface coupled to the controller. In some implementations, an exterior of the housing does not include any controls that are directly operable by a human operator.

The attachment assembly also may include: a first portion that extends in a first direction; a second portion that extends in a second direction and is connected to the first portion and to the attachment piece; a fourth portion that extends in the second direction and is connected to the attachment piece; and a fifth portion that extends in the first direction and is connected to the fourth portion, and, in these implementations, the attachment piece is between the second portion and the fourth portion. The first portion and the fifth portion may include flanges configured to hold at least one cable in the space between the side channel and the first side of the housing. The first direction may be perpendicular to the second direction.

In another aspect, a controller for a conveyor system includes: a housing including: a solid exterior that defines an interior of the housing and a notched region along a perimeter of the solid exterior; and one or more electronic components in the interior; and an attachment assembly mounted to a first side of the housing, the attachment assembly including an attachment portion, the attachment portion including: a bottom side in physical contact with the first side of the housing; and a top side opposite the bottom side, the top side extending from a first end to a second end, and the top side including: a first latch member at the first end; and a second latch member at the second end.

Implementations may include one or more of the following features. The attachment portion may be a third attachment portion, and the attachment portion also may include: a first portion that extends in a first direction; a second portion that extends in a second direction and is connected to the first portion and to the attachment portion; the third portion, the third portion extending in the first direction; a fourth portion that extends in the second direction and is connected to the attachment portion; and a fifth portion that extends in the first direction and is connected to the fourth portion, and the attachment portion is between the second portion and the fourth portion.

In some implementations, each of the first portion and the fifth portions include at least one flange that is not in direct physical contact with the first side of the housing.

Implementations of any of the techniques described herein may include an apparatus, a device, a system, and/or a method. The details of one or more implementations are set forth in the accompanying drawings and the description below. Other features will be apparent from the description and drawings, and from the claims.

DRAWING DESCRIPTION

FIGS. 1A-1C show various aspects of an example of an apparatus.

FIG. 1D shows the apparatus of FIGS. 1A-1C attached to a portion of an example of a conveyor system.

FIG. 1E is a side exterior view of an example of an attachment assembly.

FIGS. 3A-3C show various views of another example of an apparatus.

FIG. 3D is a side view of an example of an attachment assembly for the apparatus of FIGS. 3A-3C.

FIGS. 4A-4C show various views of another example of an apparatus.

FIG. 4D is a side view of an example of an attachment assembly for the apparatus of FIGS. 4A-4C.

FIGS. 5A and 5B are side and cross-sectional views, respectively, of another example of an apparatus.

FIGS. 7A-7C show various views of another example of an attachment assembly.

DETAILED DESCRIPTION

Figure 2A:
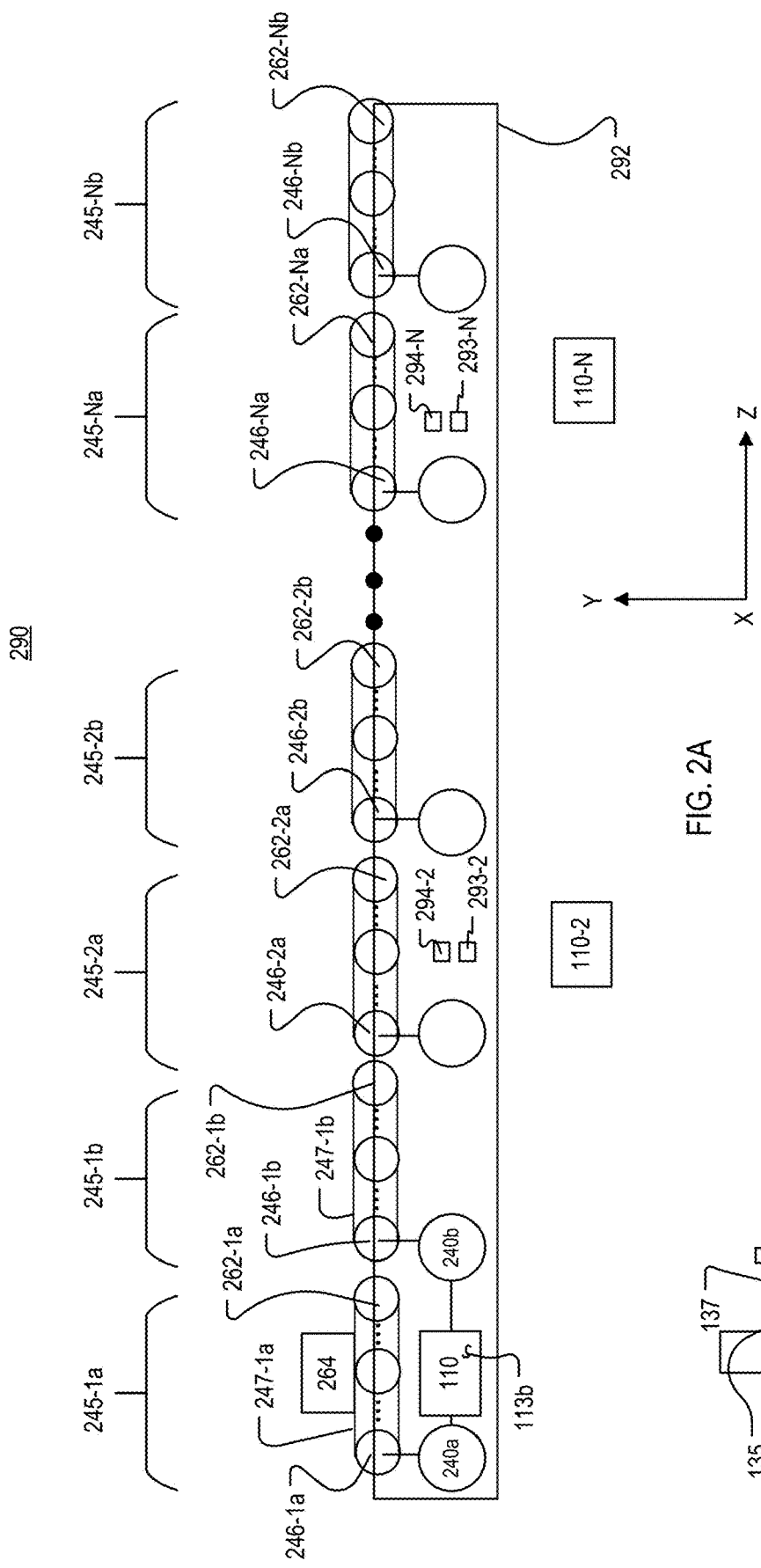
FIG. 2A is a block diagram of an example of a conveyor system.
Figure 2B:
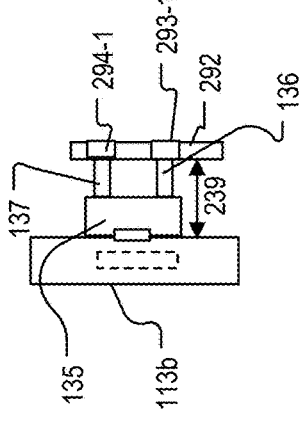
FIG. 2B is a side view of the apparatus of FIGS. 1A-1C attached to a side channel of the conveyor system of FIG. 2B.

FIGS. 1A-1C show various aspects of an apparatus 110. FIGS. 1A and 1B are side exterior views of the apparatus 110. FIG. 1C is a perspective view of the apparatus 110. The apparatus 110 includes a housing 112, which encloses a controller 120, and an attachment assembly 130 that attaches to a side 113a of the housing 112. The controller 120 is shown with a dashed line style in FIG. 1A to indicate that the controller 120 is within the housing 112. The controller 120 controls a conveyor system 190 (FIG. 1D). FIG. 1D shows the apparatus 110 attached to a portion 192 of the conveyor system 190. The portion 192 may be, for example, a side channel such as shown in FIGS. 2A and 2B. FIG. 1E is a side exterior view of the attachment assembly 130.

The conveyor system 190 is any type of conveyor system that moves items through a distance. For example, the conveyor system 190 may be used to convey raw, partially finished, and/or finished materials in an industrial process; to convey goods in a warehouse or product fulfillment center; or to convey goods in a commercial setting such as a retail food market, just to name a few. The controller 120 is any type of controller. For example, the controller 120 may be a dual-zone controller, such as in the example shown in FIGS. 2A and 2B. The controller 120 may take other forms. For example, the controller 120 may be a single-zone controller.

The configuration of the attachment assembly 130 allows the apparatus 110 to be attached to the portion 192 while maintaining a spacing 139 between the side 113a and the portion 192. The spacing 139 allows for a more densely packed overall system. For example, electronics or mechanical devices that aid in the operation of the conveyor system 190 may be placed in the spacing 139. Thus, as compared to a configuration in which a controller housing is attached to the portion 192 without a spacing, the attachment assembly 130 provides a more space-efficient and compact design. In some implementations, the attachment assembly 130 also includes a flange or extension that is configured to hold a cable, cord, and/or wiring. FIGS. 7A-7C and 8 shows an example of such a configuration. Furthermore, the attachment assembly 130 is robust and sturdy and is able to withstand greater forces than a conventional attachment system. For example, the configuration of the attachment assembly 130 allows the apparatus 110 to remain attached to the portion 192 even if a human operator uses the apparatus 110 in an unintended manner, such as by applying all or most of their weight to the apparatus 110 by standing on the apparatus 110 or by hanging from the apparatus 110. Additionally, in some implementations, such as shown in FIGS. 3A-3C, the shape of the housing 112 is such that the apparatus 110 may be conveniently stacked vertically with one or more other instances of the apparatus 110, and such a shape also allows the apparatus 110 to be more seamlessly integrated with the conveyor system 190. Also, although the apparatus 110 encloses the controller 120, the controller 120 is not accessible from the exterior of the housing 112. Thus, the apparatus 110 and the controller 120 are protected from intentional or accidental misuse by an unauthorized user.

In greater detail, the housing 112 is made of any durable, solid material. For example, the housing 112 may be a rigid plastic material or a metal material. In some implementations, the housing 112 is made by an injection molding process that encapsulates the controller 120 and its associated components. The housing 112 is a three-dimensional object. In the example of FIGS. 1A-1E, the housing 112 is a parallelepiped that has six sides: 113a, 113b, 113c, 113d, 113e, and 113f The sides 113a and 113b extend in the Y-Z plane. The sides 113c and 113d extend in the Y-Z plane. The sides 113e and 113f extend in the X-Y plane. Other shapes of the housing 112 are possible, such shown in FIGS. 3A-3C, 4A-4C, 5A, 5B, and 8. Moreover, the housing 112 may have fewer or more than six sides, and the sides may be arranged in any configuration that encloses the controller 120.

The attachment assembly 130 is attached to the side 113a with a fastening mechanism 134. The fastening mechanism 134 is any type of mechanism that is capable of securely attaching the attachment assembly 130 to the side 113a. For example, the fastening mechanism 134 may be one or more screws or bolts, and/or an adhesive.

In some implementations, the attachment assembly 130 and the housing 112 are a single three-dimensional body. In these implementations, the attachment assembly 130 and the housing 112 are not detachable from each other, and the fastening mechanism 134 is not present or required. In these implementations, the apparatus 110 is, for example, a single piece of molded plastic material or a single metal body that includes both the housing 112 and the attachment assembly 130.

Referring also to FIG. 1E, the attachment assembly 130 includes an attachment piece 135. The attachment piece 135 extends along the Y direction from a first end 131 to a second end 132 and has a thickness 133 in the X direction. The attachment piece 135 includes a first latch member 136 and a second latch member 137. The first latch member 136 is closer to the first end 131 than the second end 132, and the second latch member 137 is closer to the second end 132 than the first end 131. In some implementations, the first latch member 136 is at the first end 131, and/or the second latch member is at the second end 132.

The latch members 136 and 137 are used to attach the housing 112 to the portion 192. The first latch member 136 connects to a first connection interface 193 on the portion 192. The second latch member 137 connects to a second connection interface 194 on the portion 192. In the example shown in FIGS. 1A-1E, the first latch member 136 and the second latch member 137 extend from the attachment piece 135 in the X direction, and the connection interfaces 193 and 194 are openings in the portion 192. To attach the housing 112 to the portion 192, the first latch member 136 is inserted into the connection interface 193 and the second latch member 137 is inserted into the connection interface 194.

Other implementations are possible. For example, in some implementations, the connection interfaces 193 and 194 extend from the portion 192, and the first latch member 136 and the second latch member 137 are openings that receive and hold the connection interfaces 193 and 194. Moreover, the housing 112 may be attached to the portion 192 with just one of the latch members 136, 137. In other words, the housing 112 may be attached to the portion 192 by connecting the first latch member 136 to the connection interface 193 but without connecting the second latch member 137 to the connection interface 194, or vice versa.

Regardless of the configuration of the latch members 136 and 137 and the connection interfaces 193 and 194, when the first latch member 136 and/or the second latch member 137 is connected to the portion 192, the housing 112 is held to the portion 192 with the space 139 between the portion 192 and the side 113a. As discussed above, the space 139 may be used to accommodate devices that are used in the control of the conveyor system 190.

FIGS. 3A-3D, 4A-4D, 5A, 5B, 6A, 6B, 7A-7C, and 8 show various implementations of the apparatus 110, the housing 112, and/or the attachment assembly 130. Before discussing the various implementations of the housing 112 and the attachment assembly 130, an example of a conveyor system 290 is discussed with respect to FIG. 2.

FIG. 2A is a block diagram of the conveyor system 290. The conveyor system 290 includes a side channel 292 and N zones 245-1a, 245-1b, 245-2a, 245-2b, . . . 245-Na, 245-Nb, where N is an integer number that is greater than zero. Each of the N zones includes two conveying portions that are formed from rollers and a conveying surface. For example, the zone 245-1a includes rollers 246-1a and 262-1a, and a conveying surface 247-1. The rollers 246-1a and 262-1a extend along the X axis (into and out of the page). The rollers 246-1a and 262-1a rotate about the X axis. The rollers 246-1a and 262-1a are shown as having a circular cross-section, but may have other shapes. The rollers 246-1a and 262-1a may be mounted into a mounting post (not shown) that has a hexagonal or other non-circular cross-section that passes through a similarly shaped hole in the side channel 292. The non-circular cross-section hole is used to prevent rotation.

The roller 246-1a and the roller 262-1a make physical contact with the conveying surface 247-1a. The conveying surface 247-1a is a flexible material that encircles the roller 246-1a and the roller 262-1a such that when the roller 246-1a rotates, the conveying surface 247-1a and the item 264 move. The conveying surface 247-1 is any type of surface that is capable of supporting and moving an item 264. The conveying surface 247-1 may be, for example, a belt or a chain. Moreover, the conveyor system 290 may be implemented without the conveying surface 247-1. For example, the rollers 246-1a and 262-1a may make direct contact with the item 264 such that the item 264 is conveyed through the zone 245-1a by the rollers alone and without an intervening surface. The other zones are configured in the same manner as the zone 245-1a.

The conveyor system 290 utilizes N instances of the apparatus 110, with each instance of the apparatus 110 being configured as a dual-zone motor controller that controls two of the N zones. The N instances of the apparatus 110 are labeled as 110, 110-2, . . . 110-N, where N is an integer number that is greater than two. The N instances of the apparatus 110 are referred to collectively as the N apparatuses 110. The apparatus 110 drives motors 240a and 240b. The motor 240a is connected to a roller 246-1a. When the motor 240a receives a motor power signal from the apparatus 110, the motor 240a operates and causes the roller 246-1a to rotate about the X axis. The motor 240b drives a roller 246-1b in a similar manner. Although this example discusses the motors 240a and 240b, other mechanisms may be used to rotate the rollers 246-1a and 246-1b. For example, the rollers 246-1a and 246-1b may be rotated by a pneumatic drive in which one motor constantly moves a belt that rotates the rollers 246-1a and 246-1b. To provide another example, a magnetic drive may be used to cause electromagnets to move the rollers 246-1a and 246-1b. The other zones in the conveyor system 290 are similarly formed.

The rollers (including the N rollers 246, the N rollers 262) and the N apparatuses 110 are mounted on the side channel 292. The side channel 292 is a solid, wall-like structure that extends generally in the Y-Z plane. The side channel 292 also may include a second channel that extends in the X-Z plane and is connected to the wall-like structure that extends in the Y-Z plane. In a traditional system that includes the second channel, the second channel is used to hold, for example, controls, pneumatic hoses, and other peripheral devices. Regardless of the configuration of the side channel 292, the attachment assembly 130 makes more efficient use of the side channel 292 and reduces the overall size of the side channel 292. Moreover, the attachment assembly 130 eliminates or reduces the need for the second channel, thus providing a single-channel solution, which results in lower costs and reduces space requirements.

The side channel 292 may be made of a metal material or any other material that is sufficiently sturdy to support rollers, the N apparatuses 110, and any additional devices applicable to the application. The side channel 292 includes connection interfaces that allow the N apparatuses 110 to attach to the side channel 292. In the example of FIG. 2A, the apparatus 110 is attached to the side channel 292 with the side 113b facing away from the side channel 292.

The connection interfaces 293-2 and 294-2 and 293-N and 294-N are labeled in FIG. 2A. For example, to attach the apparatus 110-2 to the side channel, the first latch member is connected to the connection interface 293-2, and the second latch member is connected to the connection interface 294-2. In the example shown in FIGS. 2A and 2B, the N connection interfaces 293 and 294 are openings that passes through the side channel 292. The latch members of the N apparatuses 110 are inserted into the respective connection interfaces on the side channel 292 to attach the N apparatus 110-2 to the side channel 292. FIG. 2B shows a side view of the apparatus 110 attached to the side channel 252. The latch member 136 is inserted into the connection interface 293-1, and the latch member 137 is inserted into the connection interface 294-1.

The connection interface 293-1 may hold the latch member 136 with, for example, an interference fit. In some implementations, the latch member 136 is configured to move relative to the attachment piece 135. In these implementations, the latch member 136 is inserted into the connection interface 293-1 and then moved (for example, twisted or rotated) to more securely attach the latch member 136 to the connection interface 293-1. The latch member 137 is attached to the connection interface 294-1. The latch member 137 may be configured in the same manner as the latch member 137, or the latch member 137 may be configured in a different manner.

FIGS. 3A-3D relate to an apparatus 310. The apparatus 310 is another example implementation of the apparatus 110. The apparatus 310 encloses the controller 120 (FIG. 1A). The apparatus 310 may be used in any conveyor system that has a mounting portion such as a side channel, such as the conveyor system 190 or the conveyor system 290. FIG. 3A is a perspective view of a side 313b of the apparatus 310. FIG. 3B is a view of a side 313a of the apparatus 310. The side 313a is opposite the side 313b. FIG. 3C is a cross-sectional view of the apparatus 310 taken along the line 3B-3B' of FIG. 3B. FIG. 3D is a side view of an attachment assembly 330 for the apparatus 310.

The apparatus 310 is a three-dimensional object that includes a rugged and solid housing 312 that has a first side 313a and a second side 313b, which is opposite the first side 313a. The housing 312 also includes sides 313e and 313f, which extend between the first side 313a and the second side 313b. Additionally, the housing 312 includes sides 313c and 313d, which also extend between the first side 313a and the second side 313b but are not in the same planes as the sides 313a and 313f. The housing 312 includes various interfaces 360 that extend from the sides 313e and 313f.

The interfaces 360 are any type of interface that is capable of delivering or sending signals or electrical power. For example, the interfaces 360 may be coaxial cable connections, pin connectors, or network interfaces. The interfaces 360 may be used to provide data or control signals to devices in the conveyor system. For example, one or more of the interfaces 360 may be used to provide a motor driver signal to a motor in a conveyor system. In another example, one of the interfaces 360 may receive power or data for the controller 120. Regardless of the use of the interfaces 360, the interface 360 are not configured to be easily used by an unauthorized user. For example, the interfaces 360 are intended to receive or send electrical signals and are not generally amenable to being controlled or sabotaged by an unauthorized user. The interfaces 360 are shown as examples, and more or fewer interfaces may be on the housing 312. For example, additional interfaces may be located on the side 313c.

The first side 313a and second side 313b extend generally in the Y-Z plane but are not necessarily entirely flat or planar in the Y-Z plane. The second side 313b extends in the Y direction from a bottom portion 351 to a top portion 352. The top portion 352 has a notch or recessed shape. The notched area formed by the shape of the top portion 352 creates space for any items that extend through the conveyor side channel. For example, the notched area may provide space for a hexagonal-shaped roller shaft end. Without the notched area, the housing 312 would interfere with the end of the roller shaft end (or other item that extends though the side channel).

The bottom portion 351 has a protruding shape that matches the notch or recessed shape of the top portion 352. Thus, a bottom portion 351 of one apparatus 310 can be placed into the top portion 352 of another, separate one of the apparatus 310. In this way, a plurality of the apparatuses 310 may be stacked along the Y direction. Other implementations are possible. For example, the housing 312 may be implemented with the notch shape in the top portion 352 but without the protruding shape in the bottom portion 351.

Referring to FIGS. 3B and 3C, the side 310a includes a base surface 359 and a wall 353 that extends from the base surface 359 generally in the X direction for a distance 354. The wall 353 is permanently attached to the side 313a and is part of the housing 312. For example, the wall 353 may be molded with the base surface 359.

The apparatus 310 also includes the attachment assembly 330. FIG. 3D is a side view of the attachment assembly 330. The attachment assembly 330 includes an attachment piece 335 that extends in the Y direction from a first end 331 to a second end 332. The attachment piece 335 also includes a first latch member 336, which is at the first end 331, and a second latch member 337, which is at the second end 332. In the example shown, the first latch portion 336 is a cube-like block that extends from the end 331. The first latch member 336 is configured to fit into a corresponding opening in a side channel (such as the side channel 292 of FIGS. 2A and 2B). The second latch member 337 is attached at the second end 332. The second latch member 337 is illustrated as a cube-like structure that fits into a corresponding opening on the side channel.

Other implementations of the first latch member 336 and the second latch member 337 are possible. For example, either or both of the first latch member 336 and the second latch member 337 may be attached to the attachment piece 335 with a mechanism that allows the member 336 or 337 to move relative to the attachment piece 335. For example, the second latch member 337 may be connected to the end 332 with a hinge or post that allows the second latch member 337 to rotate. In these implementations, the second latch member 337 may be rotated after being inserted into the corresponding opening of the side channel to more securely attach the housing 312 to the side channel. In other examples, the latch member 336 and/or 337 may be configured to slide relative to the attachment piece 335. Moreover, the latch member 336 and/or 337 may have shapes other than what is shown in FIGS. 3B-3D.

The attachment piece 335 has a thickness or extent 333 in the X direction. In the example of FIGS. 3A-3D, the extent 333 is less than the distance 354. However, in other implementations, the extent 333 is greater than or equal to the distance 354. In other words, the wall 353 and the attachment piece 335 can extend from the base surface 359 by the same amount in the X direction.

The attachment piece 335 is attached to the base surface 359 by a fastening mechanism 334. In this example, the fastening mechanism 334 is a screw, and the attachment piece 335 includes an opening 356 that receives the screw 334. The screw 334 is inserted into the opening 356 and secured to the base surface 359 to thereby attach the attachment assembly 330 to the side 313a. The screw 334 is provided as an example. Other mechanisms, such as a pin, a nail, and/or adhesives, may be used instead of or in addition to the screw 334. The attachment piece 335 makes direct contact with the side 313a.

In some implementations, the attachment assembly 330 and the housing 312 are a single three-dimensional body. In these implementations, the attachment assembly 330 and the housing 312 are not detachable from each other, and the fastening mechanism 334 is not present or required. In these implementations, the apparatus 310 is, for example, a single piece of molded plastic material or a single metal body that includes both the housing 312 and the attachment assembly 330.

When the attachment piece 335 is mounted to the base surface 359, two recessed regions 357a and 357b are formed. The recessed region 357a is an open region between a first part 358a of the wall 353 and the attachment assembly 330. The recessed region 357b is an open region between a second part 358b of the wall 353 and the attachment assembly 330. As shown in FIGS. 3B and 3C, the recessed regions 357a and 357b are on opposite sides of the attachment assembly 330. The recessed regions 357a and 357b provide space for devices (for example, wiring) when the apparatus 310 is attached to a side channel. In implementations in which the distance 354 associated with the wall 353 is greater than the extent 333 of the attachment piece 335, the wall 353 makes contact with the side channel and therefore provides a spacing between the side 313a (and the base surface 359) and the side channel when the apparatus 310 is attached to the side channel. In implementations in which the distance 354 is the same or smaller than the extent 333, the attachment piece 335 and/or the latch members 336 and/or 337 provide the spacing.

FIGS. 4A-4D relate to an apparatus 410. The apparatus 410 is another example of an implementation of the apparatus 110. The apparatus 410 may be attached to a side channel of a conveyor system (such as the side channel 292 of FIG. 2A). The apparatus 410 is similar to the apparatus 310, but has some distinctions. For example, the apparatus 410 includes two separate attachment assemblies 430. FIG. 4A is a perspective view of a side 413b of the apparatus 410. FIG. 4B is a view of a side 413a of the apparatus 410. The side 413a is opposite the side 413b. FIG. 4C is a cross-sectional view of the apparatus 410 taken along the line 4B-4B' of FIG. 4B. FIG. 4D is a side view of the attachment assembly 430.

The apparatus 410 includes a housing 412 that encloses the controller 120 (FIG. 1A). The side 413b of the housing 412 extends along the Y direction from a bottom portion 451 to a top portion 452. The top portion 452 has a notched region similar to the notched region at the top portion 352 of the housing 312 (FIGS. 3A and 3B). However, the bottom portion 451 does not include a protruding region. Instead, the bottom portion 451 is substantially linear in the Z direction.

FIG. 4B shows the side 413a of the housing 412. The side 413a includes a wall 453 that extends from a base surface 459 in the X direction for a distance 454. The wall 453 is permanently attached to the side 413a. For example, the wall 453 may be molded with the base surface 459. The base surface 459 is substantially planar in the Y-Z plane. Two identical attachment assemblies 430 are on the side 413a. The attachment assemblies 430 are separated from each other in the Z direction. The wall 453 also extends along the Z direction between the two identical attachment assemblies 430. Together, the wall 453 and the two attachment assemblies 430 form a U-shaped recessed region 457. The recessed region 457 is an open region that is able to accommodate and hold devices that are used in the operation of the conveyor system or the controller 120.

FIG. 4D is a side view of one of the attachment assemblies 430. The attachment assembly 430 includes an attachment piece 435 that has an extent 433 in the X direction. The attachment piece 435 extends in the Y direction from a first end 431 to a second end 432. The attachment assembly 430 also includes a first latch member 436, which is at the first end 431, and a second latch member 437, which is at the second end 432. The latch members 436 and 437 extend farther in the X direction than the extent 433, and the latch members 436 and 437 are configured to attach to corresponding connection interfaces on the side channel.

The attachment piece 435 also defines an opening 456, which receives a fastening mechanism 434 that attaches the attachment piece 435 to the side 413a. The fastening mechanism 434 may be, for example, a screw. The attachment assembly 430 includes one opening and accepts one fastening mechanism. However, other implementations are possible. For example, more than one fastening mechanism may be used and different types of fastening mechanisms may be used.

When the apparatus 410 is attached to a side channel (such as the side channel 292), the side 413a is separated from the side channel by a space that is determined by the extent 433 and/or the distance 454. Thus, components or devices may be accommodated and held in the recessed region 457.

In some implementations, the attachment assembly 430 and the housing 412 are a single three-dimensional body. In these implementations, the attachment assembly 430 and the housing 412 are not detachable from each other, and the fastening mechanism 434 is not present or required. In these implementations, the apparatus 410 is, for example, a single piece of molded plastic material or a single metal body that includes both the housing 412 and the attachment assembly 430.

FIGS. 5A and 5B relate to an apparatus 510. The apparatus 510 is another example of an implementation of the apparatus 110. The apparatus 510 may be attached to a side channel of a conveyor system (such as the side channel 292 of FIG. 2A). The apparatus 510 is similar to the apparatuses 310 and 410, but has some distinctions. For example, the apparatus 510 includes a housing 512, which does not include a wall such as the wall 353 or the wall 453. FIG. 5A is a view of a side 513a of the apparatus 510. FIG. 5B is a cross-sectional view of the apparatus 510 taken along the line 5A-5A' of FIG. 5A.

A side 513a of the housing 512 is shown in FIG. 5A. The side 513a includes a base surface 559 that is substantially planar and extends in the Y-Z plane. The attachment assembly 430 (FIG. 4D) is attached to the base surface 559 with the attachment piece 435 extending in the Y direction. The apparatus 510 also includes two identical spacer pieces 561, each of which is attached to the base surface 559. The spacer pieces 561 and the attachment assembly 430 make up an attachment assembly 530. The spacer pieces 561 may be attached to the base surface 559 with any type of attachment mechanism, including screws, nails, and/or adhesive. When attached to the base surface 559, the spacer pieces 561 are separated from each other in the Z direction. The attachment assembly 430 is between the two spaces pieces 561. Each of the spacer pieces 561 has an extent 554 in the X direction. The extent 554 may be greater than or equal to the extent 433 (which is the extent of the attachment piece 535 in the X direction). The spacer pieces 561 do not include latch members and do not attach to corresponding connection interfaces on a side channel.

As discussed above, the first latch member 436 and the second latch member 437 attach to corresponding connection interfaces in the side channel. The first and second latch members 436, 437 are used to attach the apparatus 510 to the side channel. A space exists between the side 513a and the side channel when the apparatus 510 is attached to the side channel. The extent of the space is determined by the extent of the spacer pieces 561 and/or the thickness 433 of the attachment piece 435.

In some implementations, any or all of the space pieces 561 and the attachment assembly 430 and the housing 512 form a single three-dimensional body that is permanently joined without using an adhesive.

Figure 6A:
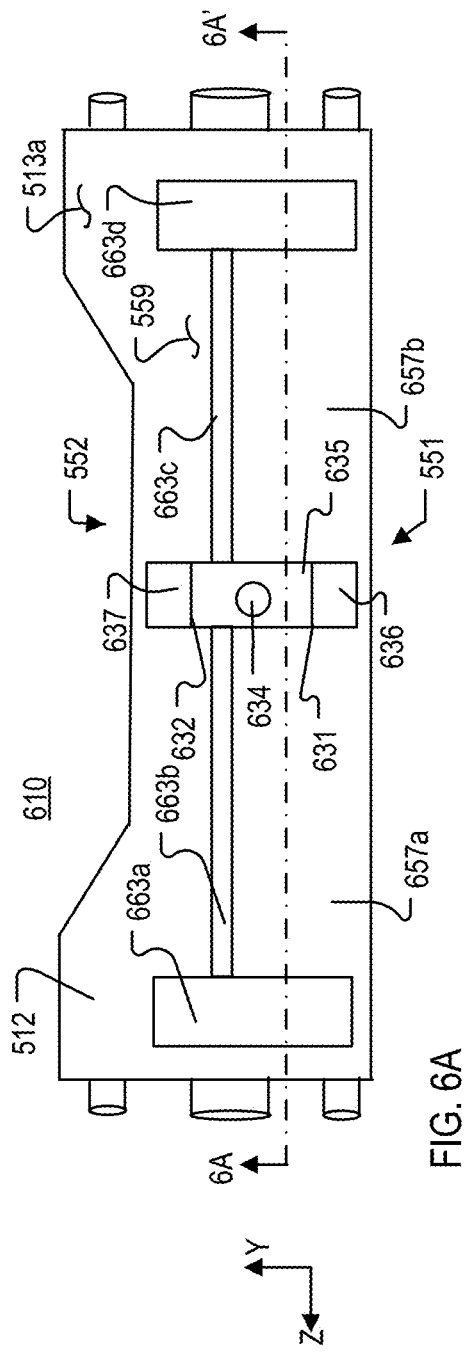
FIGS. 6A and 6B are side and cross-sectional views, respectively, of another example of an apparatus.
Figure 6B:
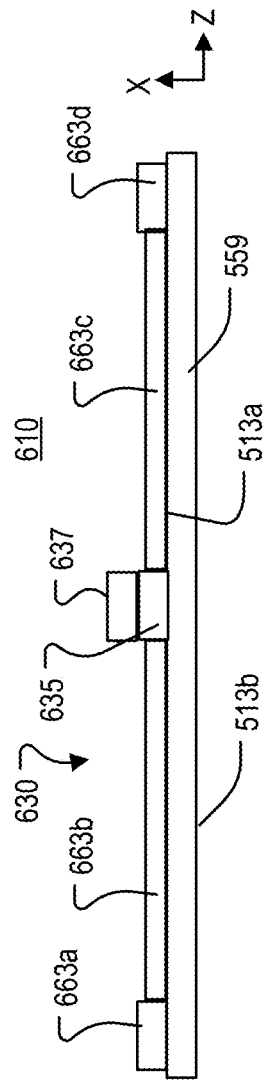

FIGS. 6A and 6B relate to an apparatus 610. FIG. 6A is a side view of the apparatus 610. FIG. 6B is a cross-sectional view of the apparatus 610 taken along the line 6A-6A' of FIG. 6A. The apparatus 610 is another example implementation of the apparatus 110 (FIG. 1A). The apparatus 610 includes the housing 512 (FIGS. 5A and 5B). However, instead of the spacer pieces 516 and the attachment assembly 430, an attachment assembly 630 is attached to the side 513a. The attachment assembly 630 includes a first portion 663a that extends in the Y direction, a second portion 663b that extends in the Z direction, a third portion 635 (or an attachment piece 635) that extends in the Y direction, a fourth portion 663c that extends in the Z direction, and a fifth portion 663d that extends in the Y direction. The first portion 663a is connected to the second portion 663b, the second portion 663b is connected to the attachment piece 635, the attachment piece is connected to the fourth portion 663c, and the fourth portion 663c is attached to the fifth portion 663d. The attachment piece 635 is between the first portion 663a and the fifth portion 663d.

The attachment assembly 630 is attached to the side 513a with one or more attachment mechanisms (not shown). The attachment mechanisms may include, for example, screws, nails, and/or adhesives. In some implementations, the attachment assembly 630 is permanently attached to the side 513a such that the housing 610 and the attachment assembly 630 are a single three-dimensional body.

The attachment piece 635 extends in the Y direction from a first end 631 to a second end 632. A first latch member 636 is at the first end 631, and a second latch member 637 is at the second end 632. The first latch member 636 and the second latch member 637 are configured for connection to corresponding connection interfaces on a side channel (such as the side channel 292 of FIGS. 2A and 2B). The portions 663a, 663b, 663c, 663d do not include latch members and do not directly connect to connection interfaces on the side channel.

Each of the portions 663a, 663b, 663c, 663d, and the connection piece 635 has an extent in the X direction. The extents may be the same or they may be different. When the first and second latch members 636 and 637 are attached to respective connection interfaces on the side channel, the side 513a is spaced or separated from the side channel by a distance that is determined by the portion 663a, 663b, 663c, 663d or the attachment piece 635 that has the greatest extent in the X direction.

In the example shown in FIGS. 6A and 6B, the attachment assembly 630 is a single piece. In other words, the various portions 663a, 663b, 663c, 663d, and 635 are permanently joined. The attachment assembly 630 may be molded as a single piece, or the various portions may be molded separately and then permanently joined, for example, by sonic welding or with an adhesive that forms a permanent bond. Such a configuration may result in the attachment assembly 630 being durable and robust such that the apparatus 610 is able to withstand relatively large forces without becoming separated from the side channel.

Figure 7C:
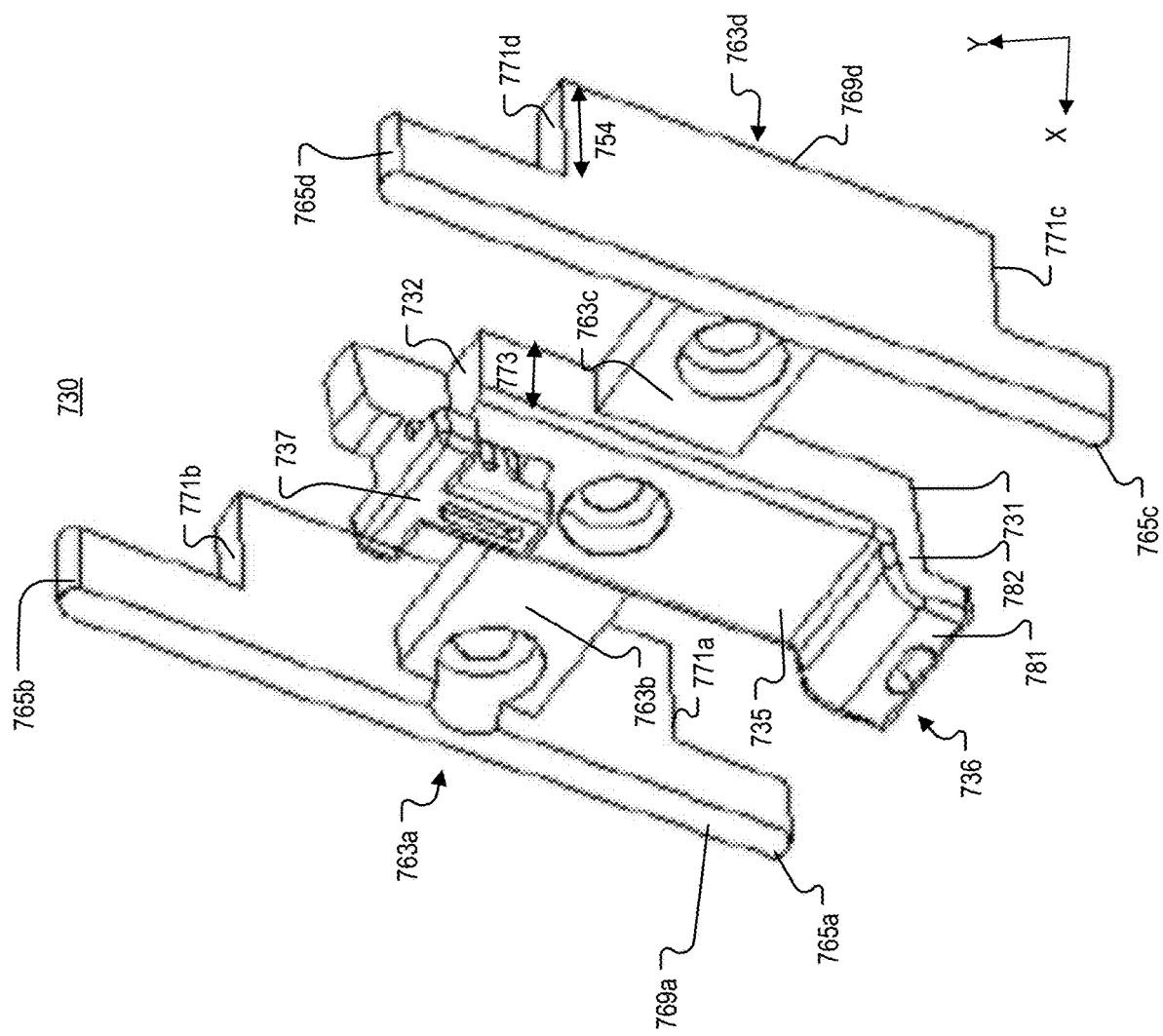
Figure 8:
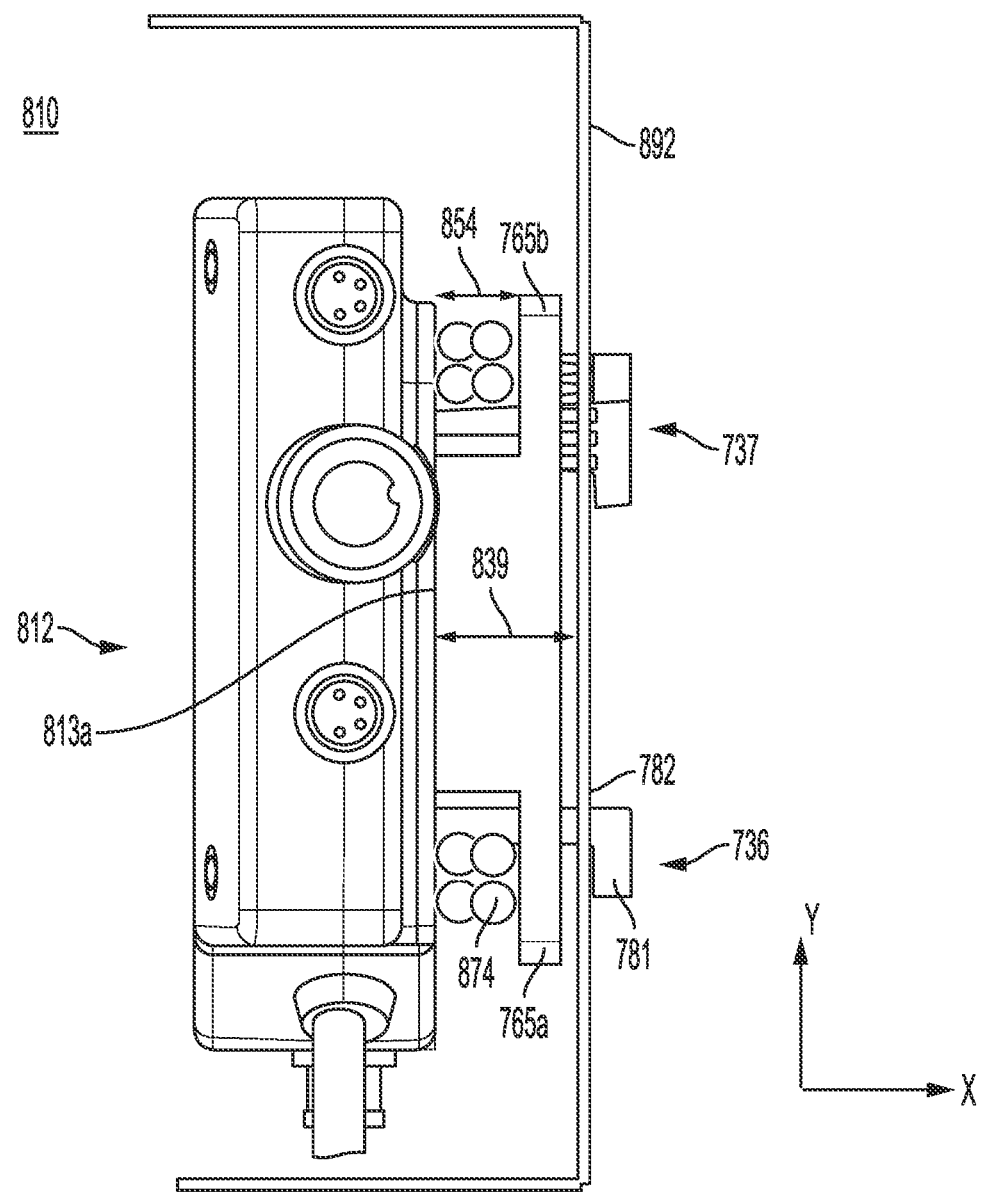
FIG. 8 is a side view of the attachment assembly of FIGS. 7A-7C attached to a controller housing and a side channel.

FIGS. 7A-7C show an attachment assembly 730, which is another example of an attachment assembly that may be used with the housings 112 or 512 discussed above, or with any other controller housing that has a substantially planar side to which the attachment assembly 730 may be secured. The attachment assembly 730 is similar to the attachment assembly 630; however, the attachment assembly 730 includes flanges 765a, 765b, 765c, 765d. FIG. 7A is a plan view of the attachment assembly 730 in the Y-Z plane. FIG. 7B is a side exterior view of the attachment assembly 730 in the X-Y plane. FIG. 7C is a side perspective view of the attachment assembly 730. FIG. 8 is a side view of the attachment assembly 730 attached to a controller housing 812 and a side channel 892.

The attachment assembly 730 includes a first portion 763a that extends in the Y direction, a second portion 763b that extends in the Z direction, a third portion 735 (or an attachment piece 735) that extends in the Y direction, a fourth portion 763c that extends in the Z direction, and a fifth portion 763d that extends in the Y direction. The first portion 763a is connected to the second portion 763b, the second portion 763b is connected to the attachment piece 735, the attachment piece is connected to the fourth portion 763c, and the fourth portion 763c is attached to the fifth portion 763d. The attachment piece 735 is between the first portion 763a and the fifth portion 763d.

The attachment assembly 730 also includes openings 756a, 756b, and 756c that are each configured to receive an attachment mechanism (for example, a screw or nail) to attach the attachment assembly 730 to a controller housing 812 (FIG. 8). The openings 756a, 756b, 756c are formed in the second portion 763b, the attachment piece 735, and the fourth portion 763c, respectively.

The attachment piece 735 extends in the Y direction from a first end 731 to a second end 732. A first latch member 736 is at the first end 731, and a second latch member 737 is at the second end 732. The first latch member 736 and the second latch member 737 are configured for connection to corresponding connection interfaces on a side channel (such as the side channel 892 of FIG. 8). In the example shown, the first latch member 736 includes a bar 782 that extends away from the end 731 in the X direction and a tab portion 781 that extends from the bar 782 in the −Y direction. The second latch member 737 has a T-like shape. Other shapes and configurations are possible, and the shapes shown are examples. The portions 763a, 763b, 763c, 763d do not include latch members and do not directly connect to connection interfaces on the side channel.

The first portion 763a and the fifth portion 763d include respective attachment portions 769a and 769d. The attachment portions 769a and 769d attach to a side 813a of the controller housing 812 (FIG. 8). The attachment portion 769a extends in the Y direction from an end 771a to an end 771b. The attachment portion 769d extends in the Y direction from an end 771c to an end 771d. Each of the attachment portions 769a and 769d also has an extent 754 in the X direction. The first portions 763a and the fifth portion 763d also include flanges. Specifically, the first portion 763a includes a flange 765a that extends in the −Y direction from the end 771a, and a flange 765b that extends in the Y direction from the end 771b. The fifth portion 763d includes a flange 765c that extends in the −Y direction from the end 771c, and a flange 765d that extends in the Y direction from the end 771d.

Referring also to FIG. 8, the attachment assembly 830 is attached to the side 813a of the controller housing 812 and to the side channel 892. The side 813a is separated from the side channel by a space 839. The extent of the space 839 in the X direction is determined by the extent 754, 733, and/or the dimensions and configuration of the latch mechanism 736 and/or 737. As discussed above, the space 839 allows various devices to be held in a more efficient manner.

In addition to the space 839, there is also a gap 854 that extends in the X direction between each of the flanges 765a-765d and the side 813a. The gap 854 is formed because the attachment portions 769a and 769d have the extent 754 in the X direction, but the flanges 765a-765d do not make contact with the side 813a. The gap 854 is used to hold a cable 874. Thus, the flanges 765a-765d provide an additional open region between the side channel 892 and the housing 812 where devices may be accommodated to achieve a more space efficient design.

Other implementations are within the scope of the claims. For example, any of the attachment assemblies 130, 330, 430, 530, or 630 may be implemented with flanges.

What is claimed is:

1. An apparatus comprising:
    a housing that encloses a controller configured to control a conveyor system; and
    an attachment assembly attached to a first side of the housing, wherein the attachment assembly is configured to attach the housing to a side channel of the conveyor system, and the attachment assembly comprises an attachment piece, the attachment piece comprising:
        a first latch member configured for connection to a first interface on the side channel of the conveyor system; and
        a second latch member configured for connection to a second interface on the side channel of the conveyor system; and wherein, when one or more of the first latch member is connected to the first interface and the second latch member is connected to the second interface, the housing is attached to the side channel with a space between the side channel and the first side of the housing.

2. The apparatus of claim 1, wherein the first latch member is configured for insertion into a first opening on a side channel of the conveyor system; and the second latch member is configured for insertion into a second opening on the side channel.

3. The apparatus of claim 2, wherein the attachment piece extends from a first end to a second end, the first latch member is closer to the first end than the second end, and the second latch member is closer to the second end than the first end.

4. The apparatus of claim 3, wherein the attachment piece comprises an attachment member that is in direct physical contact with the first side of the housing, a first flange that extends from the attachment member to the first end, and a second flange that extends from the attachment member to the second end; the first flange and the second flange are not in direct physical contact with the first side of the housing and are separated from the first side of the housing by a gap; and the gap is sufficient to accommodate at least one cable.

5. The apparatus of claim 4, wherein the housing further comprises a top portion, and when the first latch is inserted in the first opening and the second latch is inserted in the second opening, a notched region of the top portion accommodates an item of the conveyor system that extends through the side channel.

6. The apparatus of claim 5, wherein the housing further comprises a bottom portion comprising a protrusion portion that fits into a notched region on a top portion of a separate apparatus.

7. The apparatus of claim 1, wherein the attachment piece is removeably attached to the first side of the housing.

8. The apparatus of claim 1, wherein the attachment piece and the housing are a single piece, and the attachment piece is not removable from the first side of the housing.

9. The apparatus of claim 1, wherein the space between the side channel and the first side has an extent, and the extent is determined by a thickness of the attachment piece.

10. The apparatus of claim 1, wherein the first side of the housing comprises a base surface and a wall that extends outward from the base surface to a height, the attachment piece has a thickness that is the same as the height of the wall, and the space has an extent that is the same as the thickness of the attachment piece and the height of the wall.

11. The apparatus of claim 10, wherein the attachment piece is a first attachment piece, and the attachment assembly further comprises a second attachment piece; and wherein the first attachment piece and the second attachment piece are attached to opposite ends of the first side, and the wall extends between the first attachment piece and the second attachment piece.

12. The apparatus of claim 1, wherein the attachment piece is a first attachment piece, and the attachment assembly comprises at least one other attachment piece.

13. The apparatus of claim 12, wherein all of the attachment pieces are removeably attached to the first side.

14. The apparatus of claim 12, wherein only the first attachment piece comprises the first latch member and the second latch member.

15. The apparatus of claim 1, wherein the housing further comprises at least one data interface coupled to the controller.

16. The apparatus of claim 15, wherein an exterior of the housing does not include any controls that are directly operable by a human operator.

17. The apparatus of claim 1, wherein the attachment assembly further comprises:
    a first portion that extends in a first direction;
    a second portion that extends in a second direction and is connected to the first portion and to the attachment piece;
    a fourth portion that extends in the second direction and is connected to the attachment piece; and
    a fifth portion that extends in the first direction and is connected to the fourth portion, wherein
    the attachment piece is between the second portion and the fourth portion.

18. The apparatus of claim 17, wherein the first portion and the fifth portions include flanges configured to hold at least one cable in the space between the side channel and the first side of the housing.

19. The apparatus of claim 17, wherein the first direction is perpendicular to the second direction.

20. A controller for a conveyor system, the controller comprising:
    a housing comprising:
        a solid exterior that defines an interior of the housing and a notched region along a perimeter of the solid exterior; and
        one or more electronic components in the interior; and
    an attachment assembly mounted to a first side of the housing, the attachment assembly comprising an attachment portion, the attachment portion comprising:

a bottom side in physical contact with the first side of the housing; and a top side opposite the bottom side, the top side extending from a first end to a second end, and the top side comprising: a first latch member at the first end; and a second latch member at the second end.

21. The controller of claim 20, wherein the attachment portion is a third attachment portion, and the attachment portion further comprises:

a first portion that extends in a first direction;

a second portion that extends in a second direction and is connected to the first portion and to the attachment portion;

the third portion, wherein the third portion extends in the first direction;

a fourth portion that extends in the second direction and is connected to the attachment portion; and a fifth portion that extends in the first direction and is connected to the fourth portion, wherein the attachment portion is between the second portion and the fourth portion.

22. The apparatus of claim 21, wherein each of the first portion and the fifth portions include at least one flange that is not in direct physical contact with the first side of the housing.

\* \* \* \* \*